US009613846B2

(12) United States Patent
Raj et al.

(10) Patent No.: US 9,613,846 B2
(45) Date of Patent: Apr. 4, 2017

(54) PAD DESIGN FOR ELECTROSTATIC CHUCK SURFACE

(71) Applicant: Applied Materials, Inc., Santa Clara, CA (US)

(72) Inventors: Govinda Raj, Bangalore (IN); Cheng-Hsiung Tsai, Cupertino, CA (US); Robert T. Hirahara, San Jose, CA (US); Kadthala R. Narendrnath, San Jose, CA (US); Manjunatha Koppa, Bangalore (IN); Ross Marshall, Campbell, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 147 days.

(21) Appl. No.: 14/550,106

(22) Filed: Nov. 21, 2014

(65) Prior Publication Data

US 2015/0146339 A1    May 28, 2015

Related U.S. Application Data

(60) Provisional application No. 62/007,272, filed on Jun. 3, 2014, provisional application No. 61/907,907, filed on Nov. 22, 2013, provisional application No. 61/907,924, filed on Nov. 22, 2013.

(51) Int. Cl.
| | | |
|---|---|---|
| *H02H 7/30* | (2006.01) | |
| *H01L 21/687* | (2006.01) | |
| *H01L 21/683* | (2006.01) | |

(52) U.S. Cl.
CPC ...... *H01L 21/6875* (2013.01); *H01L 21/6831* (2013.01); *Y10T 428/24298* (2015.01); *Y10T 428/24314* (2015.01)

(58) Field of Classification Search
CPC .................. H01L 21/6875; H01L 21/6831
USPC ........................................... 361/234
See application file for complete search history.

(56) References Cited

U.S. PATENT DOCUMENTS

| | | | |
|---|---|---|---|
| 5,753,132 A | 5/1998 | Shamouilian et al. | |
| 5,863,396 A | 1/1999 | flanigan | |
| 6,483,690 B1 * | 11/2002 | Nakajima | ........... H01L 21/6833 361/234 |
| 6,506,291 B2 * | 1/2003 | Tsai | ................ C23C 14/50 118/724 |
| 9,036,326 B2 * | 5/2015 | Lee | ............... H01L 21/6831 361/234 |
| 2001/0011637 A1 | 8/2001 | Wytman | |
| 2002/0101596 A1 * | 8/2002 | Park | .................. G01B 11/028 356/614 |

(Continued)

FOREIGN PATENT DOCUMENTS

| | | |
|---|---|---|
| EP | 1001455 A1 | 5/2000 |
| JP | 2008263241 A | 10/2008 |

OTHER PUBLICATIONS

The International Search Report and the Written Opinion; PCT/US22014/066867; Feb. 26, 2015.

*Primary Examiner* — Scott Bauer
(74) *Attorney, Agent, or Firm* — Patterson + Sheridan, LLP

(57) ABSTRACT

Embodiments are directed to an electrostatic chuck surface having minimum contact area features. More particularly, embodiments of the present invention provide an electrostatic chuck assembly having a pattern of raised, elongated surface features for providing reduced particle generation and reduced wear of substrates and chucking devices.

9 Claims, 15 Drawing Sheets

(56) References Cited

U.S. PATENT DOCUMENTS

2008/0173638 A1* 7/2008 Mariner ................... H05B 3/24
                                                            219/553
2009/0277883 A1* 11/2009 Tandou ............. H01J 37/32623
                                                            219/121.49
2010/0039747 A1* 2/2010 Sansoni .............. H01L 21/6833
                                                            361/234

* cited by examiner

PAD DESIGN FOR ELECTROSTATIC CHUCK SURFACE

CROSS-REFERENCE TO RELATED APPLICATIONS

This application claims benefit of U.S. Provisional Patent Application Ser. No. 61/907,907, filed Nov. 22, 2013, U.S. Provisional Patent Application Ser. No. 61/907,924, filed Nov. 22, 2013, and U.S. Provisional Patent Application Ser. No. 62/007,272, filed Jun. 3, 2014, each of which is incorporated herein by reference.

FIELD

Embodiments disclosed herein generally relate to manufacturing surfaces for electrostatic chucks; more specifically, embodiments disclosed herein generally relate to a mask and pattern for an electrostatic chuck.

BACKGROUND

Electrostatic chucks are widely used to hold substrates, such as semiconductor wafers, during substrate processing in processing chambers used for various applications, such as physical vapor deposition (PVD), etching, or chemical vapor deposition. Electrostatic chucks typically include one or more electrodes embedded within a unitary chuck body, which comprises a dielectric or semi-conductive ceramic material across which an electrostatic clamping field can be generated. Semi-conductive ceramic materials, such as aluminum nitride, boron nitride, or aluminum oxide doped with a metal oxide, for example, may be used to enable Johnsen-Rahbek or non-Coulombic electrostatic clamping fields to be generated.

Variability of the chucking force applied across the surface of a substrate during processing can cause an undesired deformation of the substrate, and can cause the generation and deposition of particles on the interface between the substrate and the electrostatic chuck. These particles can interfere with operation of the chuck by affecting the amounts of chucking force. And when substrates are subsequently moved to and from the chuck, these deposited particles can also scratch or gouge the substrates and can ultimately lead to breakage of the substrate.

Non-uniform or excessive heat transfer between a substrate and the electrostatic chuck can also cause damage to the substrate and/or chuck. For example, an overchucked substrate may result in an excessively large area of contact or an excessively concentrated area of contact between the substrate and chuck surfaces. Heat transfer occurring at the area of contact may exceed physical limitations of the substrate and/or chuck, resulting in cracks or breakage, and possibly generating and depositing particles on the chuck surface that may cause further damage.

Electrostatic chucks are therefore sometimes coated with a patterned coating. In some cases, the coating is applied through a mask. Conventional masks used for coating electrostatic chucks are typically aluminum oxide, and are secured to a coating apparatus using screws or other fasteners that constrain movement of the mask. Under the extreme heat cycling encountered during typical coating operations, the masks crack and fail in a relatively short period of time. Thus, there is a need for better masks for coating electrostatic chucks.

SUMMARY

Embodiments of the present invention are directed to an electrostatic chuck surface having minimum contact area features. More particularly, embodiments of the present invention provide an electrostatic chuck assembly for reduced particle generation and reduced wear of substrates and chucking devices.

In one embodiment, an electrostatic chuck assembly provides a surface pattern including a plurality of elongated, raised features for supporting a substrate, where the features are arranged so as to substantially form a plurality of concentric circles about a center of the electrostatic chuck assembly.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

As described above the application of a non-uniform chucking force across a substrate, as well as an uneven or excessive heat transfer between the substrate and the chuck, can cause particle generation to occur at the substrate-chuck interface, which can result in damage or increased wear to the substrate and chuck. Therefore, reducing particle generation at the interface of an electrostatic chuck and a substrate may directly lead to reduced wear and the longer operational life of both elements, and may provide a more consistent and desired operation of the chuck.

Particle generation may be reduced by adjusting several design or process parameters. For example, the chuck surface may be designed to reduce or minimize the deformation of a chucked substrate, thereby reducing the probability of generating particles due to deformation of the substrate. In accordance with other physical design parameters (e.g., heat transfer gas flow), the chuck surface may employ particular arrangement(s) of contact points with the substrates, and/or may use particular material(s) having desired properties.

Figure 1:
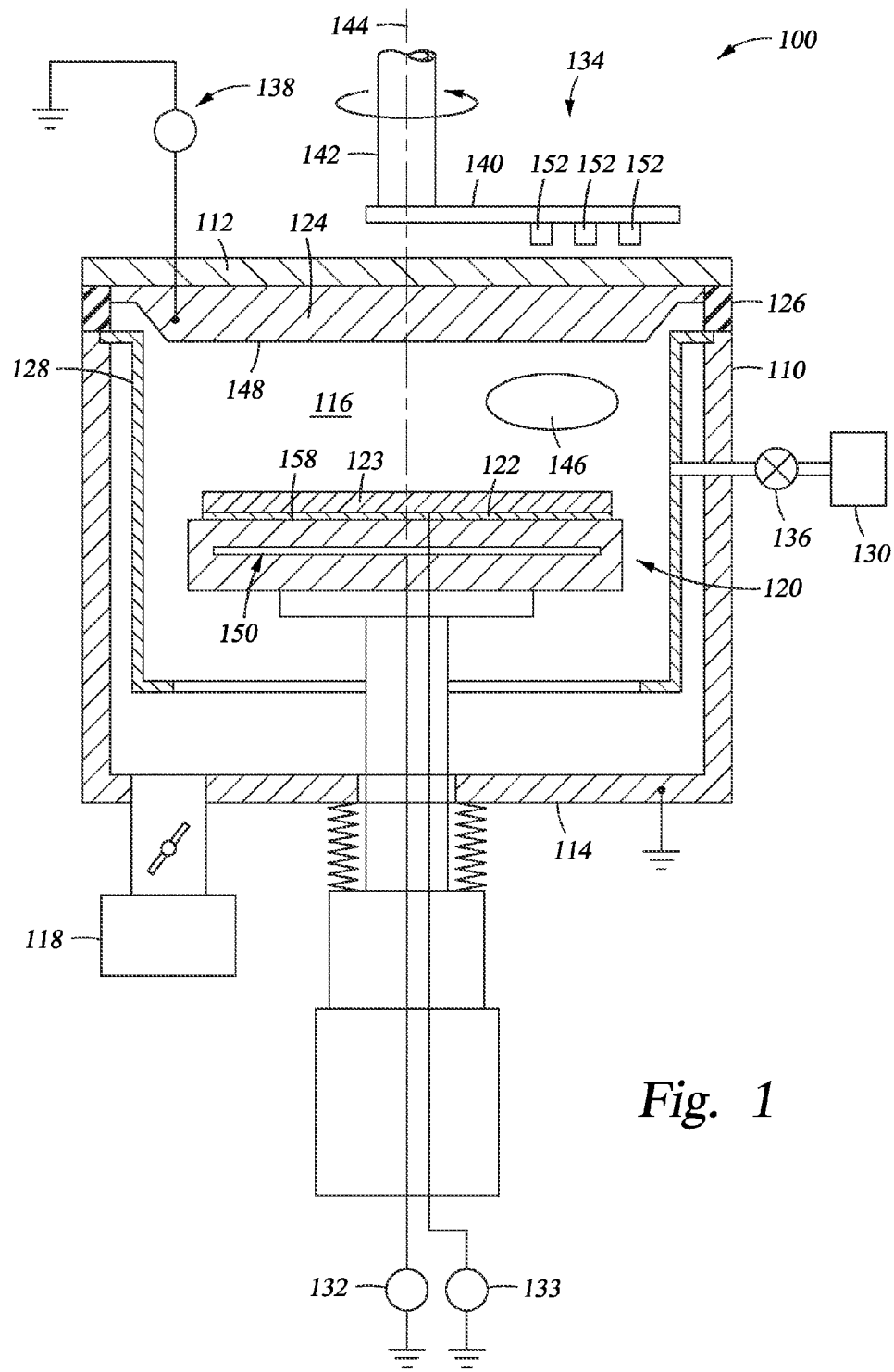
FIG. 1 is a schematic sectional side view of a physical vapor deposition (PVD) chamber within which an exemplary electrostatic chuck may be operated, according to one embodiment.

FIG. 1 illustrates a schematic sectional side view of a PVD chamber 100 within which an exemplary electrostatic chuck may be operated, according to one embodiment. The PVD chamber 100 includes chamber walls 110, a chamber lid 112, and a chamber bottom 114 defining a processing volume 116. The processing volume 116 may be maintained in a vacuum during processing by a pumping system 118. The chamber walls 110, chamber lid 112 and the chamber bottom 114 may be formed from conductive materials, such as aluminum and/or stainless steel. A dielectric isolator 126 may be disposed between the chamber lid 112 and the chamber walls 110, and may provide electrical isolation between the chamber walls 110 and the chamber lid 110. The chamber walls 110 and the chamber bottom 114 may be electrically grounded during operation.

An electrostatic chuck assembly 120 is disposed in the processing volume 116 for supporting a substrate 122 along a contact surface 158. The electrostatic chuck assembly 120 may move vertically within the processing volume 116 to facilitate substrate processing and substrate transfer. A chucking power source 132 may be coupled to the electrostatic chuck assembly 120 for securing the substrate 122 on the electrostatic chuck assembly 120, and may provide DC power or RF power to one or more chucking electrodes 150. The chucking electrodes 150 may have any suitable shape, such as semicircles, "D"-shaped plates, disks, rings, wedges, strips, and so forth. The chucking electrodes 150 may be made of any suitable electrically conductive material, such as a metal or metal alloy, for example.

A target 124 may be mounted on the chamber lid 112 and faces the electrostatic chuck assembly 120. The target 124 includes materials to be deposited on the substrate 122 during processing. A target power source 138 may be coupled to the target 124, and may provide DC power or RF power to the target to generate a negative voltage or bias to the target 124 during operation, or to drive plasma 146 in the chamber 100. The target power source 138 may be a pulsed power source. The target power source 138 may provide power to the target 124 up to about 10 kW, and at a frequency within a range of about 0.5 MHz to about 60 MHz, or more preferably between about 2 MHz and about 13.56 MHz. A lower frequency may be used to drive the bias (thereby controlling the ion energy), and a higher frequency may be used to drive the plasma. In one embodiment, the target 124 may be formed from one or more conductive materials for forming dielectric material by reactive sputtering. In one embodiment, the target 124 may include a metal or an alloy.

To allow better control the deposition of materials onto the substrate 122, a mask 123 may be positioned above the substrate 122 during processing. Mask 123 may generally be positioned or moved within chamber 100 using any feasible means known to a person of ordinary skill in the art. The mask 123 may include a plurality of openings having desired shapes, sizes, and locations in order to better control the features resulting from the deposited materials. Mask 123 may also be coupled to a mask power source 133 in order to generate a negative voltage or bias to the mask 123 during operation. Mask power source may provide power to the mask between about 100 W and about 500 W, and at a frequency within a range of about 0.5 MHz to about 60 MHz, or more preferably between about 2 MHz and about 13.56 MHz. An exemplary mask will be further discussed below with respect to FIG. 3.

A shield assembly 128 may be disposed within the processing volume 116. The shield assembly 128 surrounds the target 124 and the substrate 122 disposed over the electrostatic chuck assembly 120 to retain processing chemistry within the chamber and to protect inner surfaces of chamber walls 110, chamber bottom 114 and other chamber components. In one embodiment, the shield assembly 128 may be electrically grounded during operation.

A process gas source 130 is fluidly connected to the processing volume 116 to provide one or more processing gases. A flow controller 136 may be coupled between the process gas source 130 and the processing volume 116 to control gas flow delivered to the processing volume 116.

A magnetron 134 may be disposed externally over the chamber lid 112. The magnetron 134 includes a plurality of magnets 152. The magnets 152 produce a magnetic field within the processing volume 116 near a front face 148 of the target 124 to generate a plasma 146 so that a significant flux of ions strike the target 124 causing sputter emission of the target material. The magnets 152 may rotate or linearly scan the target to increase uniformity of the magnetic field across the front face 148 of the target 124. As shown, the plurality of magnets 152 may be mounted on a frame 140 connected to a shaft 142. The shaft 142 may be axially aligned with a central axis 144 of the electrostatic chuck assembly 120 so that the magnets 152 rotate about the central axis 144.

The physical vapor deposition chamber 100 may be used to deposit a film onto substrate 122. FIG. 1 schematically illustrates the physical vapor deposition chamber 100 in a processing configuration to deposit a film onto substrate 122 through mask 123. During deposition, a gas mixture including one or more reactive gases and one or more inert gases may be delivered to the processing volume 122 from the gas source 130. The plasma 146 formed near the front face 148 of the target 124 may include ions of the one or more inert gases and the one or more reactive gases. The ions in the plasma 146 strike the front face 148 of the target 124 sputtering the conductive material, which then reacts with the reactive gases to form a film onto the substrate 122.

Depending on the material to be formed on the substrate 122, the target 124 may be formed from a metal, such as aluminum, tantalum, hafnium, titanium, copper, niobium, or an alloy thereof. The reactive gases may include an oxidizing agent, a nitriding agent, or other reactive gases. According to one embodiment, the reactive gases may include oxygen for forming a metal oxide, or nitrogen for forming a metal nitride. The inert gases may include argon.

While PVD chamber 100 was described above with respect to the operation of an exemplary electrostatic chuck assembly to treat a substrate 122, note that a PVD chamber having the same or a similar configuration may also be used to deposit materials to produce a desired surface on an electrostatic chuck assembly. For example, the PVD chamber 100 may use the mask described in FIGS. 3-8 to produce the electrostatic chuck described in FIG. 9.

Figure 2A:
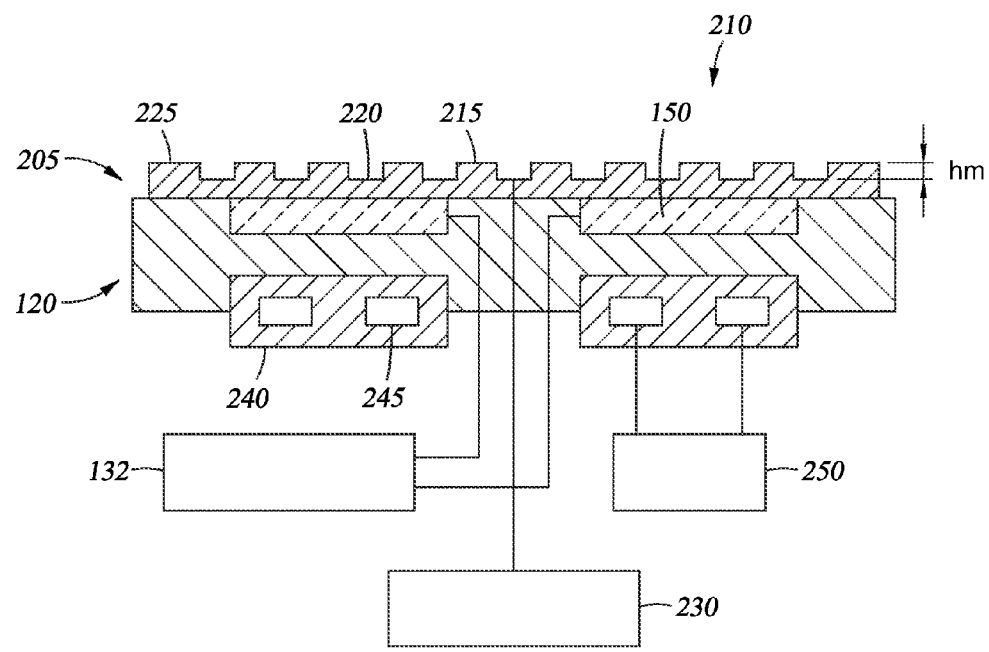
FIG. 2A is a schematic cross-sectional detail view of electrostatic chuck assembly 120 shown in FIG. 1, according to one embodiment.

FIG. 2A illustrates a schematic cross-sectional detail view of electrostatic chuck assembly 120 shown in FIG. 1, according to one embodiment. As shown, two chucking electrodes 150 are partially embedded into the assembly. The chucking electrodes 150, in combination with areas of the electrostatic chuck assembly 120, may form a frontside surface 205 of the assembly. Material may be deposited onto the chucking electrodes 150 and those areas of the electrostatic chuck assembly 120 to form material layer 210 on frontside surface 205. In an alternate embodiment, the chucking electrodes may be fully embedded in, and enclosed by, the electrostatic chuck assembly 120, so that the electrostatic chuck assembly 120 forms the entire frontside surface 205 upon which the material layer 210 is deposited.

The thickness of the material layer 210 may be preferentially selected and spatially distributed across the frontside surface 205 to form features such as mesas 215, gas grooves 220, and an outer peripheral ring 225. The mesas 215 are generally configured to support a chucked substrate during processing. The gas grooves 220 between the mesas 215 may be in fluid communication with a heat transfer gas source 230. The heat transfer gas source 230 provides a heat transfer gas that flows between the backside of a chucked substrate and the electrostatic chuck assembly 120 in order to help regulate the rate of heat transfer between the electrostatic chuck assembly 120 and the substrate. In one example, the heat transfer gas may comprise an inert gas, such as argon. The heat transfer gas may be delivered to the gas grooves 220 through one or more holes (not shown) in the electrostatic chuck assembly 120 that are in fluid communication with one or more gas grooves 220. The electrostatic chuck assembly 120 may also have an outer peripheral ring 225 that contacts the substrate near its edge, and which may be preferentially designed to control the amount of heat transfer gas that escapes from behind the substrate. Alternately, the mesas 215 may be separated by openings that are not intended to serve a heat transfer purpose.

Temperature regulation of the substrate may further be monitored and controlled using one or more cooling channels 245 disposed in a cooling plate 240. The cooling channels 245 are coupled to and in fluid communication with a fluid source 250 that provides a coolant fluid, such as water, though any other suitable coolant fluid, whether gas or liquid, may be used.

The material layer 210 may be formed by depositing material through a mask (such as mask 123) onto the frontside surface 205. As described above, use of a mask may allow better control of the size, shape, and distribution of features in the material layer 210. The mask may generally have openings that correspond to the desired features, so that material may pass through the mask onto frontside surface 205.

While depicted as having flat surfaces, mesas 215 may generally have any suitable shape and height, each of which may be preferentially selected to fulfill particular design parameters (such as a desired chucking force and/or heat transfer). Generally, mesas 215 may have a mesa height $h_M$ of about 1 micron to about 100 microns, or more preferably between about 1 micron and 30 microns. In one embodiment, and as further discussed below with respect to FIG. 10, mesas 215 may have a small rounded bump-like shape to minimize total contact area between the mesas 215 and the substrate. In another embodiment, mesas 215 may include a small bump or protrusion atop a generally flat surface. In yet another embodiment, the frontside surface 205 itself may vary between relative high and low points (similar to mesas 215 and gas grooves 220), and material layer 210 may be formed on this non-uniform surface.

Figure 2B:
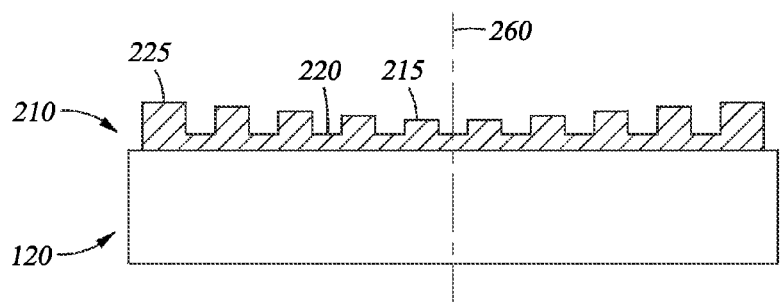
FIG. 2B is a schematic cross-sectional detail view of a material layer deposited onto an electrostatic chuck assembly, according to one embodiment.

In one or more embodiments, a non-uniform mask profile may be used to form material layer 210. Generally, the non-uniform mask profile may permit the height of each mesa 215 or depth of each gas groove 220 to be controlled individually or in combination. A material layer 210 created using the non-uniform mask profile may advantageously provide a more uniform chucking force across a substrate. FIG. 2B illustrates a schematic cross-sectional detail view of a material layer deposited onto an electrostatic chuck assembly, according to one embodiment. In this example, the height of mesas 215 increase with lateral distance from a centerline 260 of the electrostatic chuck assembly 120, so that a maximum mesa height occurs at the outermost mesa, corresponding to outer peripheral ring 225. As described above, individual mesas 215 may have any suitable shape, and the mask profile may be selected to provide mesas 215 having different sizes and/or shapes. The mask profile may provide for lateral symmetry so that corresponding mesas at a particular lateral distance from centerline 260 have the same height and/or shape.

Figure 3:
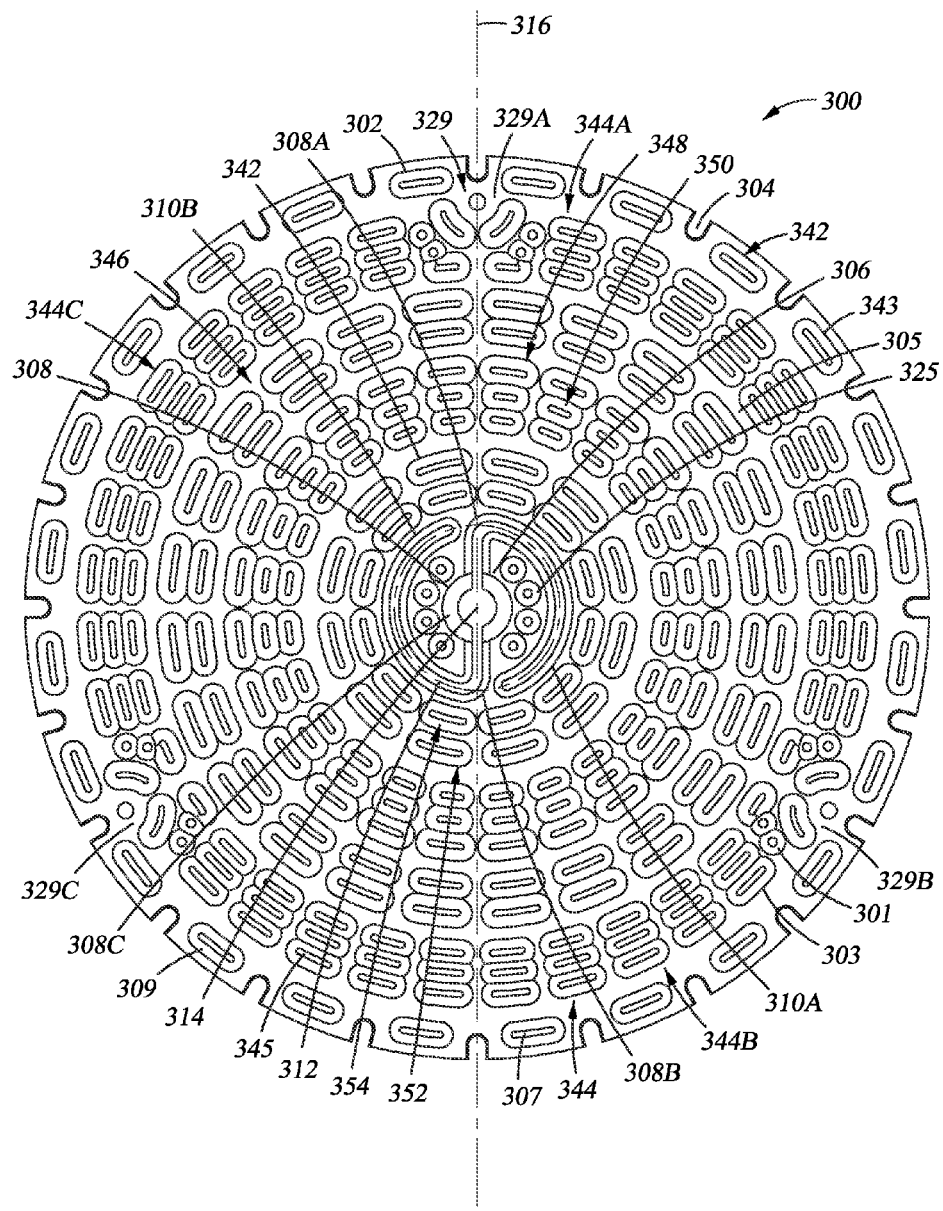
FIG. 3 is a bottom view of a mask, according to one embodiment, for coating an article using a vapor deposition process.

FIG. 3 is a bottom view of a mask 300 for coating an article, such as a chuck, using a vapor deposition process. The view of FIG. 3 is described as a "bottom view" because the mask 300 will typically be positioned with the face shown in FIG. 3 facing a substrate during processing, for example in the apparatus of FIG. 1. During such processing, the face shown in FIG. 3 will commonly point downward toward a floor of the chamber. The mask 300 may, of course, be oriented in any convenient direction.

The mask 300 may be a flat member. The mask 300 may also be a disk-shaped member. The mask 300 may have a plurality of holes 302 for exposing portions of the article for deposition of a material thereon. The holes 302 may have a flared portion 309 and a straight portion 307, about which more will be described below. The mask 300 may also have a plurality of notches 304 for alignment of the mask and securing the mask to the coating apparatus. In the embodiment of FIG. 3, the mask 300 has 24 notches, but any convenient number may be used. The mask has a thickness that may be between about 0.05" and about 0.25", such as about 0.15", and may be made from, or may include, a material selected from the group consisting of silicon nitride (SiN), aluminum nitride (AlN), silicon carbide (SiC), and zirconium oxide ($ZrO_2$). A mixture of such materials may also be used.

The mask 300 may have a plurality of round holes 301. The mask 300 may also have a plurality of elongated holes 303. The following description of the hole patterns of the mask 300 is not intended to be limiting to the exact pattern described, with variations in shape, dimension, location, and number of holes being contemplated within the general concepts described herein. In the following description, polar coordinates may be used to describe the location of certain features of the mask 300. Such description is not intended to be mathematically precise, and embodiments of the apparatus described herein may differ somewhat in shape, dimension, location, extent, or other geometric properties. In particular, the positions of holes and other features are scalable with the size of the mask.

Figure 4A:
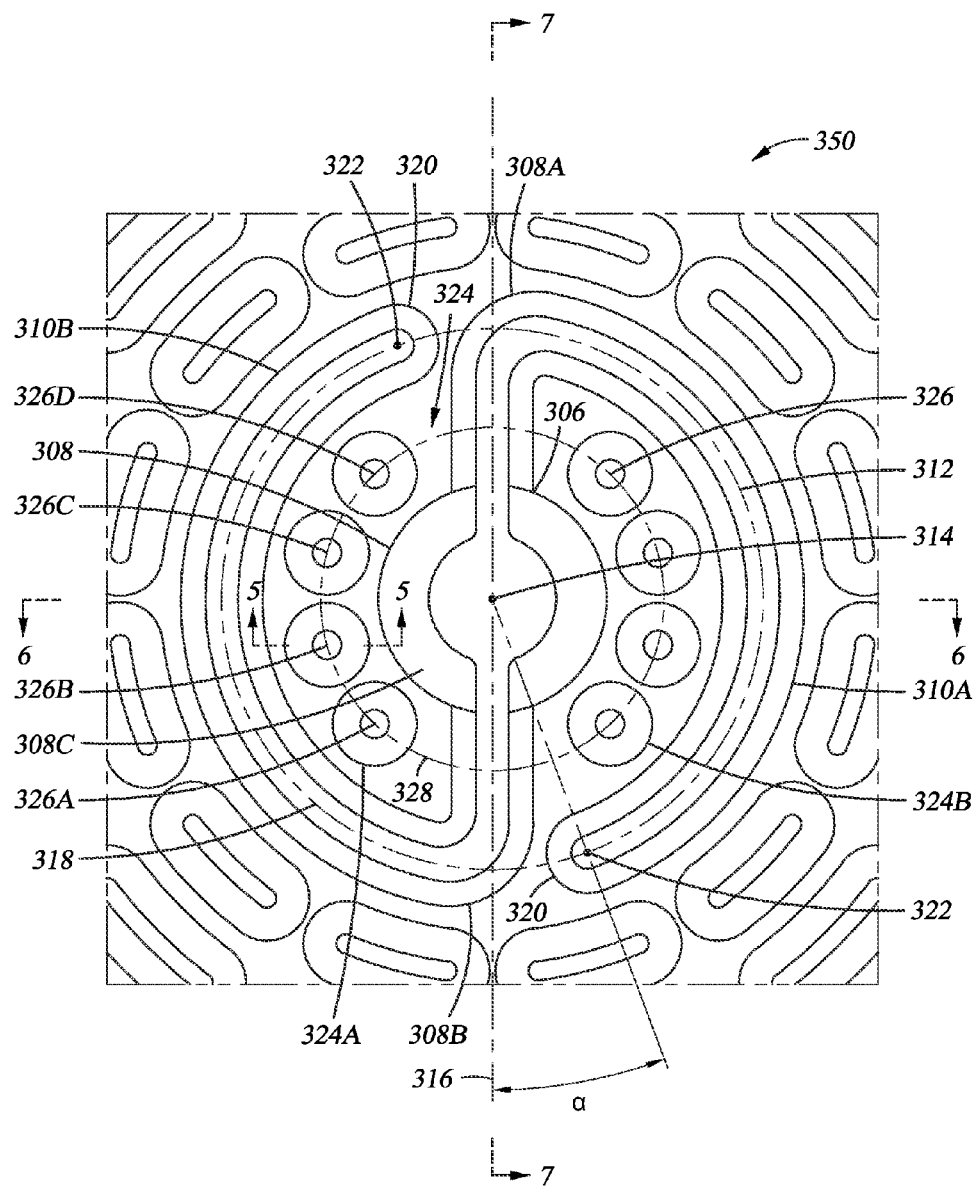
FIG. 4A is a detailed view of a central portion of the mask of FIG. 3.

FIG. 4A is a detailed view of a central portion of the mask 300 of FIG. 3. The mask 300 may have a central opening 306. The central opening 306 may be a serpentine opening. The central opening 306 may be an opening with a serpentine shape. The mask 300 may also have 13 other hole groups distinguished by location, size, and/or shape. The central opening 306 has a central portion 308, a first arm 310A, and a second arm 310B. The central portion 308 may be a straight portion. The central portion 308 may extend substantially linearly from a first end 308A to a second end 308B. The central portion 308 may have a wide portion 308C approximately midway between the first end 308A and the second end 308B. The wide portion 308C may be round.

The serpentine opening may have a straight central portion and two curved outer portions. The first arm 310A may be joined to the central portion 308 at the first end 308A of the central portion 308, and the second arm 310B may be joined to the central portion 308 at the second end 308B of the central portion 308. The first and second ends 308A, 308B define a diameter of a circle 312 concentric with a center 314 of the wide portion 308C, which is approximately at the center of the mask 300. The first and second arms 310A, 310B are curved and lie along the circle 312. The circle 312 may be at a radial location between about 7% and about 10% of the radius of the mask 300, for example about 9%. The circle 312 may be at about r=0.65" to about r=0.75", for example about r=0.70". The first arm 310A proceeds from the first end 308A of the central portion 308 around the circle 312 in a first circumferential direction, for example clockwise, and the second arm 310B proceeds from the second end 308B of the central portion around the circle 312 in the first circumferential direction, so that the two arms 310A, 310B proceed around the circle 312 in the same circumferential direction, either clockwise or counter-clockwise. An end of the first arm 310A is proximate to the second end 308B of the central portion 308, where the second arm 310B joins, and an end of the second arm 310B is proximate to the first end 308A of the central portion 308, where the first arm 310A joins. At the first end 308A of the central portion 308, where the first arm 310A joins, a center line 316 of the central portion 308 makes an angle of about 90° with a center line 318 of the first arm 310A, but in an alternate embodiment, the center lines 316, 318 may join in a curve that may be circular with any convenient radius of curvature, such as about 0.125". The second arm 310B joins to the second end 308B of the central portion 308 in the same way, with a 90° angle or a curve. Each of the first arm 310A and the second arm 310B ends at a round terminus 320 having a center 322, wherein a line from the center 314 of the wide portion 308C to the center 322 of the round terminus 320 forms an angle between about 15° and about 30°, for example about 20°, with the center line 316 of the central portion 308. The central portion 308 and the arms 310A, 310B of the central opening 306, excluding the wide portion 308C, have a width between about 0.01" and about 0.20", such as between about 0.05" and about 0.15", for example about 0.09". The wide portion 308C has a width, which may be a diameter if the wide portion 308C is circular in shape, between about 0.5" and about 1.0", for example about 0.65".

The holes within a hole group are distributed across the mask according to a pattern specific to the hole group. A first hole group 324 is located in a central region of the mask 300, as shown in FIG. 4A, and is divided into two sub-groups 324A and 324B located opposite the central portion 308 of the opening 306 from each other. Each of the sub-groups 324A and 324B has a plurality of round holes 326 with centers located on an arc of a circle 328 concentric with the wide portion 308C and the arms 310A, 310B at about r=0.5" to about r=1.0", for example about r=0.9". The circle 328 may have a radial location between about 8% and about 13% of the radius of the mask 300, for example about 12%. The holes 326 in each of the sub-groups 324A, 324B may be spaced apart from neighboring holes 326 of its sub-group by about θ=20° to about θ=40°, for example about θ=30°. Each of the sub-groups 324A, 324B may have any convenient number of holes 326, depending on the size of the holes and the space available to insert holes. The number of holes 326 in each of the sub-groups 324A, 324B may be from 1 to 10, for example 4. In one embodiment, each of the sub-groups 324A, 324B has a first hole 326A located at θ=40° from the center line 316, a second hole 326B located at θ=30° from the first hole 326A (i.e. at θ=30° from a radius drawn from the point 314 through a center of the first hole 326A), a third hole 326C located at θ=30° from the second hole, and a fourth hole 326D located at θ=30° from the third hole and at θ=40° from the center line 316. Thus, the angular extent of each of the subgroups 324A and 324B may be from about 90° to about 140°, for example about 100°. The holes 326 may be round, or another convenient shape, and may have a radius between about 0.02" and about 0.05", for example about 0.035".

Referring again to FIG. 3, a second hole group 329 is located near a periphery of the mask 300 and has three sub-groups 329A, 329B, and 329C located at angular distances of θ=120°. Thus, the three sub-groups 329A, 329B, and 329C are located equidistant around the periphery of the mask 300, and are substantially the same. Thus, the following description of the sub-group 329A applies also to the sub-groups 329B, 329C.

Figure 4B:
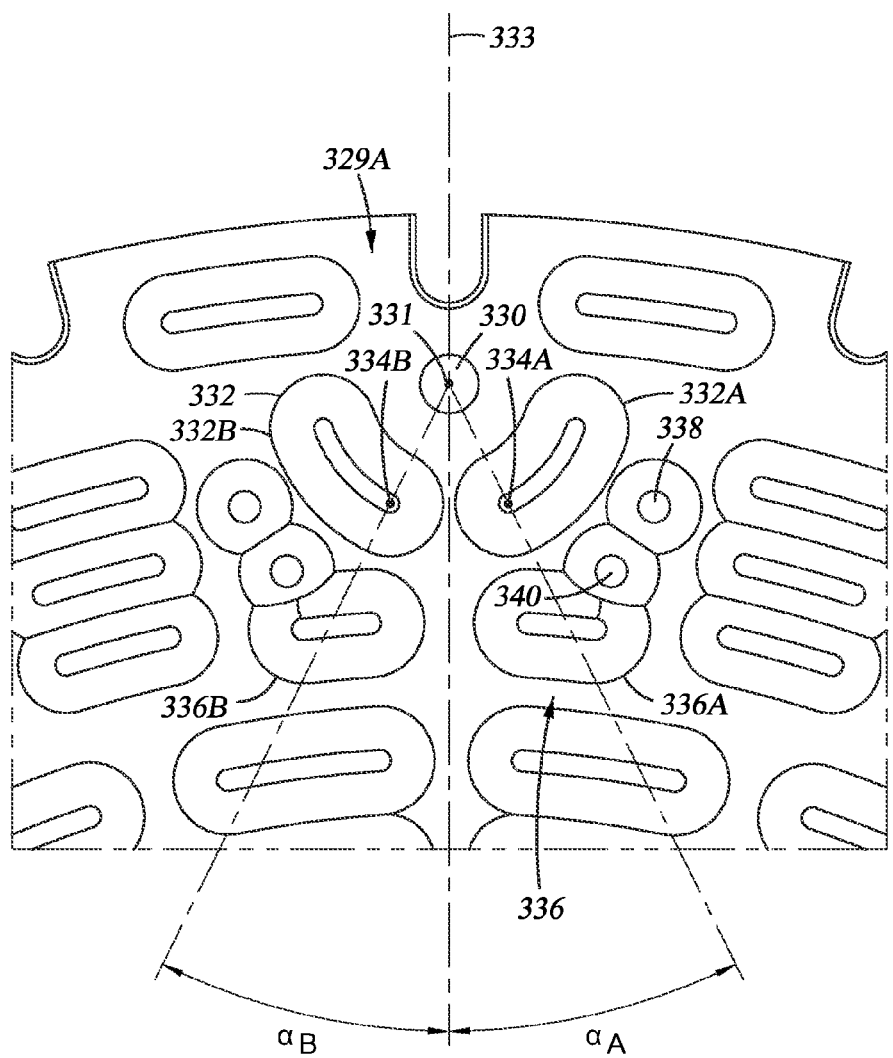
FIG. 4B is a detail view of a peripheral region of the mask of FIG. 3.

FIG. 4B is a detail view of a peripheral region of the mask 300 of FIG. 3 showing the sub-group 329A. The sub-group 329A is defined by a first hole 330 at approximately r=7", for example about r=6.9". The first hole 330 has a radius between about 0.1" and about 0.2", such as about 0.13". A line 333 from the center 314 (not shown in FIG. 4B) to a center 331 of the first hole substantially bisects the holes of the sub-group 329A. The sub-group 329A has a first elongated hole pair 332. Each hole of the first elongated hole pair 332 may lie on the mask 300 radially inward from the first hole 330 (i.e. closer to the center 314 than the hole 330), and may be aligned along an arc of a circle concentric with the first hole 330 and having a radius between about 0.3" and about 1.0", such as about 0.61". The holes of the hole pair 332 may have the same length or a different length. In the embodiment of FIG. 4B, the holes of the hole pair 332 have the same length, and each has an elongate portion ending in a round terminus at either end, with a linear distance between the round termini of each hole of the hole pair 332 being between about 0.2" and about 0.25", such as about 0.21".

Relative to the line 333 described above bisecting the sub-group 329A, which may be called a bisector, a first round terminus of the first elongated hole 332A may have a center of curvature 334A that is located an angular distance $\alpha_A$, measured using a radius drawn from the center 331 of the first hole 330 to the center of curvature 334A, of about 25° relative to the bisector 333, and a first round terminus of the second elongated hole 332B may have a center of curvature 334B that is located an angular distance $\alpha_B$, measured using a radius drawn from the center 331 of the first hold 330 to the center of curvature 334B, of about 25° from the bisector 333 on an opposite side of the bisector 333 from the first elongated hole 332A.

The sub-group 329A also has a second elongated hole pair 336, with a first elongated hole 336A and a second elongated hole 336B located opposite the bisector 333 from the first elongated hole 336A. The first and second elongated holes 336A, 336B of the second elongated hole pair 336 may be curved or straight and are located on or along a circle concentric with the mask 300 (i.e. concentric with the wide portion 316 having center 314) with a radius between about 5.5" and about 6.0", for example about 5.8". Each of the first and second elongated holes 336A, 336B of the second elongated hole pair 336 has two round termini. If the sub-group bisector 333 is defined as θ=0 about the center 314 (FIG. 3), the first and second elongated holes 336A, 336B may be located at about (5.8", ±4°) to about (5.8", ±7°). Thus, the first and second elongated holes 336A, 336B of the second elongated hole pair 336 are substantially equidistant from the bisector 333. Each of the elongated holes 336A, 336B of the second elongated hole pair 336 may therefore subtend an angle of about 3°. The elongated holes of the first and second elongated hole pairs 332, 336 may have a width of between about 0.01" and about 0.10", for example about 0.05".

The sub-group 329A also has a first round hole pair 338 and a second round hole pair 340. The first round hole pair 338 and the second round hole pair 340 may be located at a radial location from the center 314 that is between the radial location of the first hole 330 and the second elongated hole pair 336. Each hole of the first round hole pair 338 may be located at about (6.4", ±8°), and each hole of the second round hole pair 340 may be located at about (6.1", ±7°). Each hole of the round hole pairs 338, 340 may have a radius between about 0.02" and about 0.05", for example about 0.035". The sub-group 329A therefore has an extent from about 74% of the radius of the mask 300 to about 91% of the radius of the mask 300, which is from about r=5.8" to about r=6.9" for a mask of radius about 7.7", and may cover an angular distance of about 15° to about 18°, for example about 16.5°.

Referring again to FIG. 3, a third hole group 344 has three sub-groups 344A, 344B, and 344C. Each sub-group is located along an arc of a circle between two of the sub-groups 329A, 329B, and 329C. The third hole group 344 has a radial extent that is equal to or less than the radial extent of the second hole group 329, and an angular extent of the third hole group 344 is exclusive of the angular extent of the second hole group 329. Thus, each sub-group 344A, 344B, and 344C has an angular extent of about 103°, which may vary with the size of the subgroups 329A, 329B, 329C. The radial extent of the third hole group 344 may be between about r=5.9" and about r=6.6".

Each sub-group 344A, 344B, and 344C may have a plurality of concentric rows of elongated holes 345 with approximately equal angular extent. In the embodiment of FIG. 3, each sub-group 344A, 344B, and 344C has three concentric rows of 10 elongated holes, which may be curved or straight, and which may each have an angular extent of about 4.5° to about 4.8°, for example about 4.6°. The elongated holes of each sub-group 344A, 344B, and 344C may have a radius of curvature that is substantially equal to the radial location of each hole relative to the center 314. Alternately, the radius of curvature of each hole may differ from the radial location of the hole. The holes may be aligned, such that the ends of the holes lie along radii of the mask 300, as shown in FIG. 3, or the holes may be staggered according to any convenient pattern.

A plurality of hole groups may be located radially inward of the third hole group, for example between the third hole group and the opening 306. The plurality of hole groups comprises a plurality of radially aligned elongated holes. The elongated holes may be arranged in concentric rings. The elongated holes have a radial extent between about 22% and about 70% of the radius of the mask 300.

A fourth hole group 346 is located radially inward of the third hole group 344, and comprises a plurality of concentric rows of elongated holes, which may be straight or curved. In the embodiment of FIG. 3, the fourth hole group 346 has two rows of elongated holes. Each row of the fourth hole group 346 may have any convenient number of holes. In the embodiment of FIG. 3, each row of the fourth hole group 346 has 24 holes, and each hole covers an angular extent of about 7.5° to about 8.0°, for example about 7.6°. The radial extent of the fourth hole group 346 is from about 60% to about 70% of the radius of the mask 300, in the example of FIG. 3 from about r=4.7" to about r=5.2". As with the third hole group 344, each hole of the fourth hole group 346 may be straight or curved, and a radius of curvature of each hole may be equal to the radial location of the hole, or different from the radial location of the hole. The radius of curvature of each hole in the fourth hole group 346 may be the same as the radius of curvature of one or more, or all, other holes of the fourth hole group 346, or the radius of curvature of each hole in the fourth hole group 346 may be different from all other holes in the fourth hole group 346.

A fifth hole group 348 is located radially inward of the fourth hole group 346, and comprises a ring of elongated holes, which may be straight or curved. The holes of the fifth hole group 348 may be aligned with the holes of the fourth hole group 346. In the embodiment of FIG. 3, the holes of the fifth hole group 348 are aligned with those of the fourth hole group 346, so there are 24 holes, each covering the same angular extent as the holes of the fourth hole group 346, which is about 7.5° to about 8.0°, for example about 7.6°. The fifth hole group 348 may be located at a radius of about r=3.8" to about r=4.3", for example about r=4.1". Thus, the fifth hole group 348 may have a radial location from about 45% of the radius of the mask 300 to about 60% of the radius of the mask 300, for example about 55% of the radius of the mask 300. In embodiments where the holes of the fifth hole group 348 are curved, each hole may have a radius of curvature equal to, or different from, the radial location of the hole, and each hole of the fifth hole group may have the same radius of curvature or a different radius of curvature from another hole in the fifth hole group 348, or from all other holes in the fifth hole group 348.

A sixth hole group 350 may be disposed radially inward of the fifth hole group 348, and comprises a plurality of concentric rows of elongated holes, which may be straight or curved. In the embodiment of FIG. 3, the sixth hole group 350 has two rows of elongated holes. Each row of the sixth hole group 350 may have any convenient number of holes. In the embodiment of FIG. 3, each row of the sixth hole group 350 has 24 holes. The holes of the sixth hole group 350 may be aligned with the holes of the fifth hole group 348 and/or the holes of the fourth hole group 346. Each hole of the sixth hole group 350 may cover an angular extent less than that of the holes of the fifth hole group 348 and/or the fourth hole group 346. In the embodiment of FIG. 3, each hole of the sixth hole group 350 has an angular extent of about 4.5° to about 5.5°, for example about 5.0°. The radial extent of the sixth hole group 350 is from about 40% to about 50% of the radius of the mask 300, in the example of FIG. 3 from about r=3.2" to about r=3.7". Each hole of the sixth hole group 350 may be straight or curved, and a radius of curvature of each hole may be equal to the radial location of the hole, or different from the radial location of the hole. The radius of curvature of each hole in the sixth hole group 350 may be the same as the radius of curvature of one or more, or all, other holes of the sixth hole group 350, or the radius of curvature of each hole in the sixth hole group 350 may be different from all other holes in the sixth hole group 350.

A seventh hole group 352 may be disposed radially inward of the sixth hole group 350, and comprises a ring of elongated holes, which may be straight or curved. The holes of the seventh hole group 352 may be aligned with the holes of the sixth hole group 350, the fifth hole group 348, and/or the fourth hole group 346. In the embodiment of FIG. 3, the holes of the seventh hole group 352 are aligned with those of the sixth hole group 350, the fifth hole group 348, and the fourth hole group 346. The seventh hole group 352 may have any convenient number of holes. In the embodiment of FIG. 3, there are 12 holes in the seventh hole group 352. Thus, each hole of the seventh hole group 352 is aligned with a pair of holes of the sixth hole group 350. Each hole of the seventh hole group 352 may be positioned such that a line from the center 314 through a center of the hole passes between two holes of the sixth hole group 350. Each hole of the seventh hole group 352 may cover an angular extent greater than that of the holes of the sixth hole group 350, the fifth hole group 348, and/or the fourth hole group 346. In the embodiment of FIG. 3, each hole of the seventh hole group 352 has an angular extent of about 15.0° to about 16.0°, for example about 15.6°. The seventh hole group 352 may be located at a radius of about r=2.3" to about r=2.7", for example about r=2.5". Thus, the seventh hole group 352 may have a radial location from about 27% of the radius of the mask 300 to about 37% of the radius of the mask 300, for example about 32% of the radius of the mask 300. Each hole of the seventh hole group 352 may be straight or curved, and a radius of curvature of each hole may be equal to the radial location of the hole, or different from the radial location of the hole. The radius of curvature of each hole in the seventh hole group 352 may be the same as the radius of curvature of one or more, or all, other holes of the seventh hole group 352, or the radius of curvature of each hole in the seventh hole group 352 may be different from all other holes in the seventh hole group 352.

An eighth hole group 354 may be disposed radially inward of the seventh hole group 352, and comprises a ring of elongated holes, which may be straight or curved. The holes of the eighth hole group 354 may be aligned with the holes of the seventh hole group 352, the sixth hole group 350, the fifth hole group 348, and/or the fourth hole group 346. In the embodiment of FIG. 3, the holes of the eighth hole group 354 are aligned with those of the seventh hole group 352, the fifth hole group 348, and the fourth hole group 346. The eighth hole group 354 may have any convenient number of holes. In the embodiment of FIG. 3, there are 12 holes in the eighth hole group 354. Thus, each hole of the eighth hole group 354 is aligned with a hole of the seventh hole group 352. In the embodiment of FIG. 3, each hole of the eighth hole group 354 has an angular extent the same as the angular extent of the seventh hole group 352, or about 15.0° to about 16.0°, for example about 15.6°. The eighth hole group 354 may be located at a radius of about r=1.9" to about r=2.3", for example about r=2.0". Thus, the eighth hole group 354 may have a radial location from about 22% of the radius of the mask 300 to about 30% of the radius of the mask 300, for example about 36% of the radius of the mask 300. Each hole of the eighth hole group 354 may be straight or curved, and a radius of curvature of each hole may be equal to the radial location of the hole, or different from the radial location of the hole. The radius of curvature of each hole in the eighth hole group 354 may be the same as the radius of curvature of one or more, or all, other holes of the eighth hole group 354, or the radius of curvature of each hole in the eighth hole group 354 may be different from all other holes in the eighth hole group 354.

A ninth hole group 342 may be disposed near a periphery of the mask 300, and comprises a ring of elongated holes 342, which may be straight or curved. The holes of the ninth hole group 354 may be aligned with the holes of the eighth hole group 354, the seventh hole group 352, the sixth hole group 350, the fifth hole group 348, the fourth hole group 346, and/or the third hole group 344. In the embodiment of FIG. 3, the holes of the ninth hole group 342 are aligned with those of the fourth hole group 346, the fifth hole group 348, and the sixth hole group 350. The ninth hole group 342 may have any convenient number of holes. In the embodiment of FIG. 3, there are 24 holes in the ninth hole group 342. Thus, each hole of the ninth hole group 342 is aligned with a hole of the fourth hole group 346, a hole of the fifth hole group 348, and/or a hole of the sixth hole group 350. In the embodiment of FIG. 3, each hole of the ninth hole group 342 has an angular extent of about 4° to about 6°, for example about 5°. The eighth hole group 354 may be located at a radius of about r=7.1" to about r=7.4", for example about r=7.3". Thus, the ninth hole group 342 may have a radial location from about 92% of the radius of the mask 300 to about 97% of the radius of the mask 300, for example about 95% of the radius of the mask 300. Each hole of the ninth hole group 342 may be straight or curved, and a radius of curvature of each hole may be equal to the radial location of the hole, or different from the radial location of the hole. The radius of curvature of each hole in the ninth hole group 342 may be the same as the radius of curvature of one or more, or all, other holes of the ninth hole group 342, or the radius of curvature of each hole in the ninth hole group 342 may be different from all other holes in the ninth hole group 342.

The various hole groups of the mask 300 are summarized below in Table 1.

TABLE 1

| Hole Group | Subgroup | Number of Holes | Type | Radial Location | Group Angular Extent | Hole Angular Extent | Sub-Group Angular Spacing | Hole Angular Spacing |
|---|---|---|---|---|---|---|---|---|
| 324 | 324A | 1-10 | Round | 8-13% | 90°-140° | | ~30° | |
| | 324B | 1-10 | Round | 8-13% | 90°-140° | | ~30° | |

TABLE 1-continued

| Hole Group | Subgroup | Number of Holes | Type | Radial Location | Group Angular Extent | Hole Angular Extent | Sub-Group Angular Spacing | Hole Angular Spacing |
|---|---|---|---|---|---|---|---|---|
| 329 | 329A | 9 | Mixed | 74-91% | 15°-18° | | ~120° | |
| | 329B | 9 | Mixed | 74-91% | 15°-18° | | ~120° | |
| | 329C | 9 | Mixed | 74-91% | 15°-18° | | ~120° | |
| 344 | 344A | 30 | Elongated | 75-84% | 100°-110° | 4.5°-4.8° | 10°-20° | 6.0°-6.5° |
| | 344B | 30 | Elongated | 75-84% | 100°-110° | 4.5°-4.8° | 10°-20° | 6.0°-6.5° |
| | 344C | 30 | Elongated | 75-84% | 100°-110° | 4.5°-4.8° | 10°-20° | 6.0°-6.5° |
| 346 | | 48 | Elongated | 60-70% | | 7.5°-8.0° | | 7.0°-7.5° |
| 348 | | 24 | Elongated | 45-60% | | 7.5°-8.0° | | 7.0°-7.5° |
| 350 | | 48 | Elongated | 40-50% | | 4.5°-5.5° | | 9.5°-10.5° |
| 352 | | 12 | Elongated | 27-37% | | 15°-16° | | 14°-15° |
| 354 | | 12 | Elongated | 22-30% | | 15°-16° | | 14°-15° |
| 342 | | 24 | Elongated | 92-97% | | 4.0°-6.0° | | 9°-11° |

Figure 5:
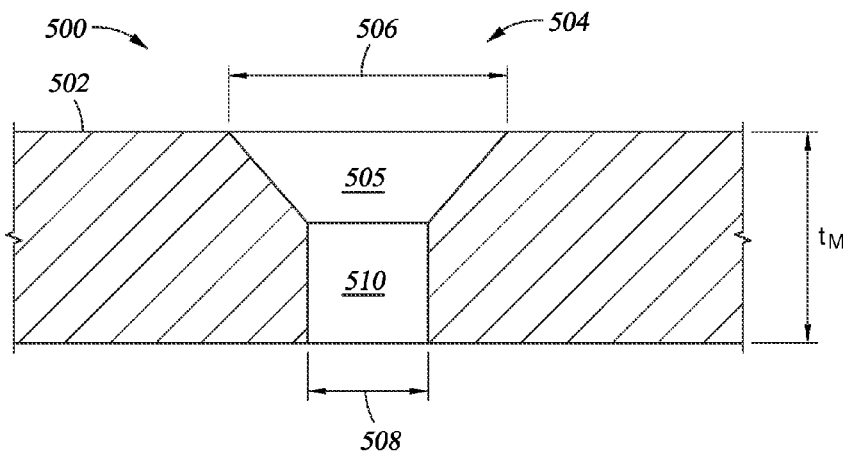
FIG. 5 is a cross-sectional detail view of a portion of a mask according to one embodiment.

FIG. 5 is a cross-sectional detail view of a portion of a mask 500, according to one embodiment. The mask depicted in FIG. 5 may be the mask 123, the mask 300, or any mask meeting the descriptions herein. The mask 500 has a thickness $t_M$, a surface 502, and an opening 504 that penetrates through the entire mask thickness $t_M$. The opening 504 has a countersunk area 505 as well as a vertical area 510. As described here, "vertical" is not intended as an absolute direction, but is relative to a plane defined, for example, by the mask surface 502, which may be referred to as "horizontal." Countersunk area 505 may have any feasible chamfer angle, for example 82° or 90°. Generally, the width 506 of countersunk area 505, at its greatest extent, may be between about 0.05 inches and about 0.2 inches, and is greater than the width 508 of the vertical area 510. The width 508 may generally be between about 0.02 inches and about 0.1 inches. In one embodiment, the width 506 is approximately 0.165 inches, and width w is approximately 0.05 inches. The cross-sectional detail view of FIG. 5 may correspond to the holes of the mask 300 of FIG. 3. The countersunk area 505 may correspond to the flared portion 309 and the vertical area 510 may correspond to the straight portion 307.

As described above with respect to FIG. 1, the mask 123, or the mask 300, may be coupled to mask power source 133 to generate a negative voltage or bias to the mask during operation, and the corresponding generated electric field may cause ions from the precursor gas(es) to be accelerated toward the mask. For example, the masks 123 and 300 may have a conductive surface coating, and may also have the coating in certain areas of the mask openings. To form features on a substrate 122, the mask 123 or 300 may be positioned over the substrate with the mask surface visible in FIG. 3 proximate to, or in contact with, the substrate surface. In such a configuration, openings in the mask 300 will be positioned with the flared portion 309, or the countersunk area 505 of FIG. 5, facing the substrate. It is believed that, as some proportion of ions will pass through the openings in the mask, through the vertical area 510 and then through the countersunk area 505 of FIG. 5, that the effects of the electric field on those ions may made to decrease as the walls of the countersunk area 505 diverge. This effect may be realized by coating the interior walls of the vertical portion 510 with a conductive material, and coupling the conductive material to an electrical bias to maintain an electric field in the vertical portion 510. A portion of the countersunk area 505 may also be coated with a conductive material. In response to the decreased effect, the ions having a similar (i.e., positive) charge may tend to repel each other, and thus begin to diffuse. The distribution caused by the diffusion of ions may be used advantageously to create a rounded bump shape on surface features; as ions accumulate within a particular mask opening, new ions passing through the opening may have less time to diffuse and so may tend build up more centrally within the mask opening.

Figure 6:
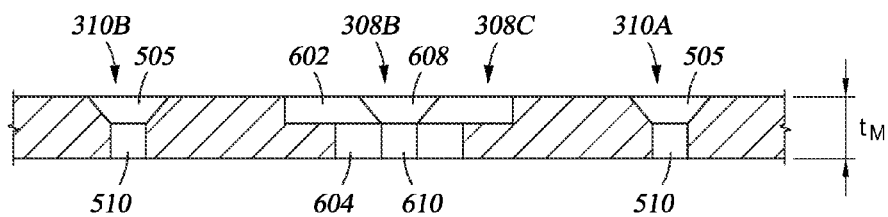
FIG. 6 is a cross-sectional detail view of a portion of the mask of FIG. 3.

FIG. 6 illustrates a cross-sectional detail view of a portion of the mask 300, according to another embodiment. The view of FIG. 6 shows a cross-section through the holes 326 and the central portion 308C (FIG. 3), with the second end 308B visible in partial cross-section in the background. The holes 326 have the countersunk area 505 and vertical area 510 of FIG. 5. The central portion 308C has a wide area 602 and a narrow area 604. The wide area has a width between about 0.5" and about 1.0", for example about 0.65", corresponding to the width of the central portion 308C, and the narrow area 604 has a width between about 0.3" and about 0.4", for example about 0.325".

Figure 7:
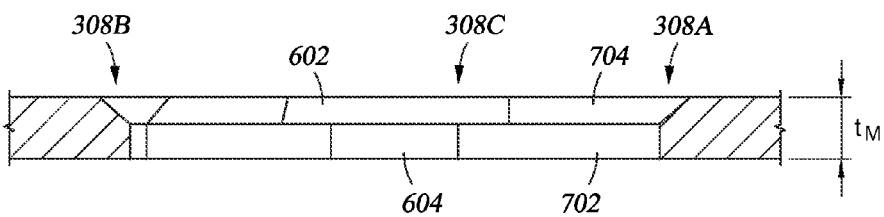
FIG. 7 is a cross-sectional detail view of another portion of the mask of FIG. 3.

FIG. 7 illustrates a cross-sectional detail view of a portion of the mask 300 taken longitudinally along the central portion 308 (FIG. 3). In the view of FIG. 7, the wide portion 308C, the first end 308A, and the second end 308B are visible in cross-section. The wide area 602 and the narrow area 604 are visible. In addition, it can be seen that the first end 308A and the second end 308B have a flared portion 704 and a straight portion 702, similar to the flared portion 309 and the straight portion 307 of the other holes in the mask 300, as described in connection with FIG. 3. The flared portion 704 of the first and second ends 308A, 308B may flare at an angle similar to the flared portion 309, which subtends an angle of about 82°. The flared portion 704 has a depth of about 0.075", and the straight portion 702 makes the balance of the mask thickness $t_M$, having a depth of about 0.078".

It should be noted that all dimensions and radial locations disclosed above in describing the masks 123 and 300 are scalable to the size of the mask.

Figure 8:
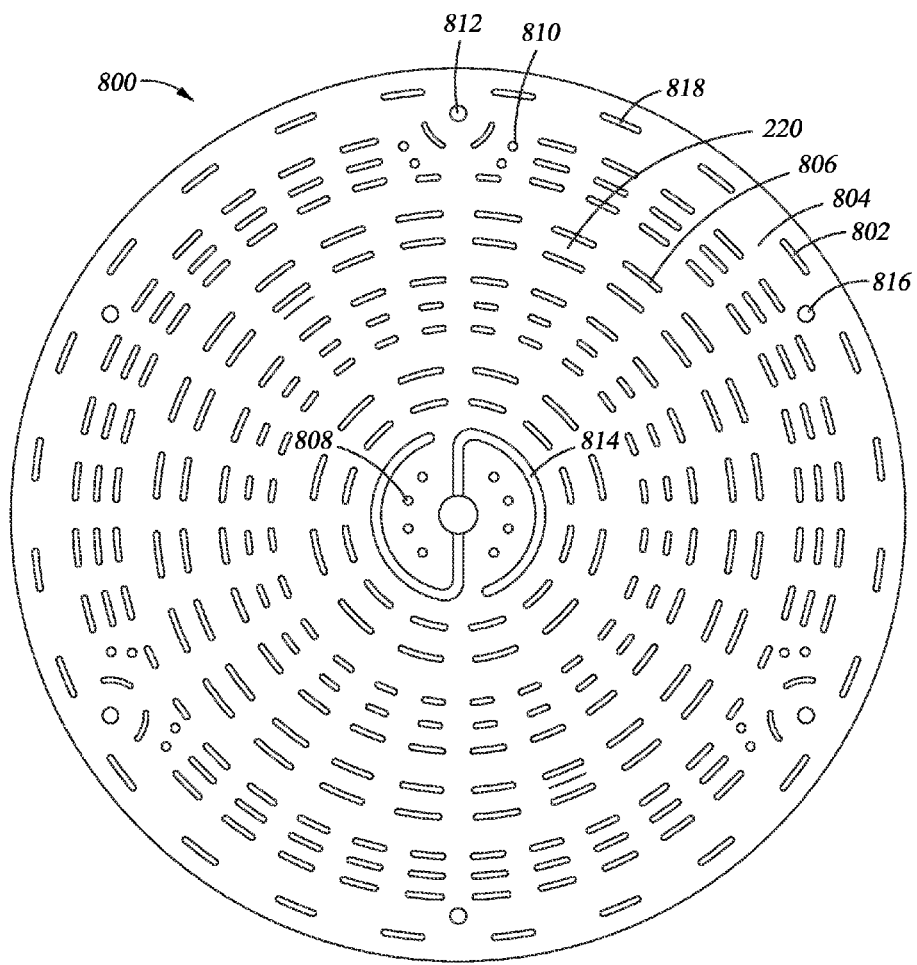
FIG. 8 is a top view of an electrostatic chuck surface with an arrangement of minimum contact area features, according to one embodiment.

FIG. 8 illustrates a top view of an electrostatic chuck surface 800 with an arrangement of minimum contact area features, according to one embodiment. The electrostatic chuck surface 800 has a plurality of features 802 of deposited material that correspond to the mask openings previously described with respect to FIGS. 3-7 separated by unmodified areas 804 of the surface 800. The features may be bumps, and a bump will have the same size and location as a corresponding hole of the mask 300. Thus, the description of each hole in the mask 300 above may be applied to the features or bumps 802 of the electrostatic chuck surface 800.

The unmodified areas 804 of the surface 800 may include a layer of the same materials deposited to form the features 802. The features 802 may include elongated features 806 that correspond to the mesas 215 of FIG. 2, rounded features 808, 810, and 812, and center tap features 814. The surface 800 may also have lift pin hole openings 816. The features 802 may generally be arranged in concentric circles, and an outermost circle 818 of features may correspond to the outer peripheral ring 225. Gas grooves 220 may be along the surface 800 between the features 802; the gas grooves 220 may also have concentric shapes, or may also extend in different directions, such as radially from a center of the surface 800.

The dimensions and arrangement of features 802 on the surface 800 may correspond to the openings in the mask 123 or the mask 300. Therefore, in one embodiment, the features 802 may be arranged in concentric circles, and may have a lateral distance between adjacent circles of about 0.1 inches to about 0.5 inches. The length of elongated features, such as mesas 215, may also fall within a range of about 0.1 inches to about 0.5 inches. The length between adjacent elongated features, such as mesas 215, within the same concentric circle may also fall within a range of about 0.1 inches to about 0.5 inches. As described above, mesa height $h_M$ may be about 1 micron to about 100 microns, or more preferably between about 1 micron and 30 microns, for example, about 10 microns.

To provide further wear reduction and particle generation reduction for an electrostatic chuck surface, a material composition to be deposited onto the surface as the material layer may be preferentially selected based on several properties. For example, an improved surface may exhibit one or more of a greater hardness, a greater modulus of elasticity, reduced coefficient of friction, and/or a reduced wear factor. In one embodiment, the material layer may include titanium nitride. In another embodiment, the material layer may include known diamond-like carbon (DLC) compositions, which may include commercially available products such as DYLYN™ (a trademark of Sulzer Ltd.).

Figure 9:
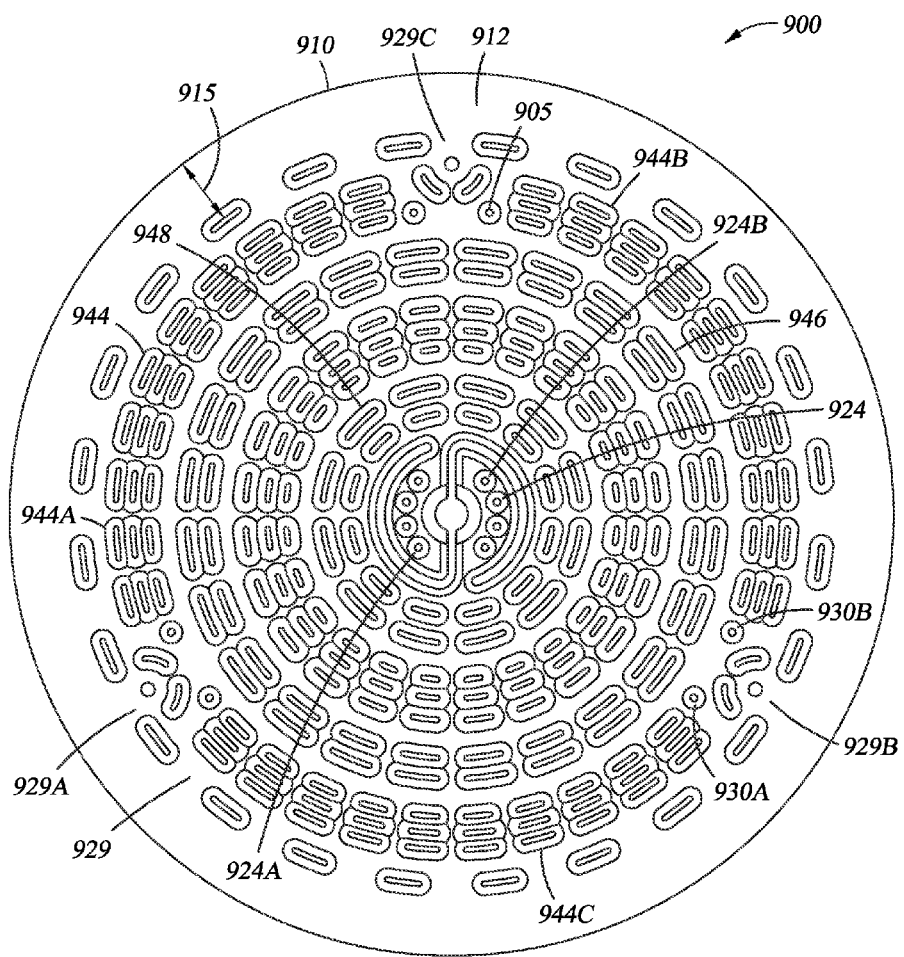
FIG. 9 is a bottom view of a mask, according to another embodiment, for coating an article using a vapor deposition process.

FIG. 9 is a bottom view of a mask 900, according to another embodiment, for coating an article, such as an electrostatic chuck, using a vapor deposition process. The mask 900 is similar to the mask 300. However, the mask 900 does not have the notches 304 of the mask 300. The mask 900 has an edge 910 that is spaced apart from the nearest holes to create a rim 912 having a dimension 915 between the outermost holes and the edge 910 of about 0.8" to about 1.2", for example about 1.0". The mask 900 also generally has hole groups corresponding to the hole groups of the mask 300.

A first hole group 924, with subgroups 924A and 924B, of the mask 900 corresponds to the first hole group 324 of the mask 300 and may have radial location generally in the same range, for example about r=0.9". The holes of each subgroup 924A and 924B have angular spacing of about 30°, and angular extent between about θ=±45° and about θ=±135°, for an angular extent of about 90°.

A second hole group 929, with subgroups 929A, 929B, and 929C, of the mask 900 corresponds to the second hole group 329 of the mask 300. The second hole group 929 has holes similar to the holes 332A and 332B of the mask 330, and instead of the holes 336A, 336B, 338, and 340 of the mask 300, the second hole group 929 has holes 930A and 930B located at about (6.0", ±7.1°) relative to the center of the mask 900 and to a bisector of each subgroup 929A, 929B, and 929C of the second hole group 929, defined in a similar way to the bisector 333. The subgroups 929A, 929B, and 929C have subgroup angular spacing of about 120° and radial extent of about 6.0" to about 6.9", or about 68% to about 79% of the radius of the mask 900.

A third hole group 944 of the mask 900, with subgroups 944A, 944B, and 944C, corresponds to the third hole group 344 of the mask 300, and the holes of the two hole groups are similar. The subgroups 944A, 944B, and 944C each have three rows of 10 holes, with the rows located at about r=6.0", r=6.3", and r=6.6", or about 69%, 72%, and 76% of the mask radius, respectively. The third hole group 944 may have radial extent between about 67% and about 77% of the radius of the mask 900. Angular extent of the holes of the third hole group 944 may be about 10° with respect to a radius of curvature located about r=3.6" or 41% of the radius of the mask 900.

A fourth hole group 946 of the mask 900 has 5 rings of elongated holes at about r=3.3", r=3.6", r=4.1", r=4.8", and r=5.2", or about 38%, 41%, 47%, 55%, and 60% of the radius of the mask 900, respectively, each ring having 24 holes. Radial extent of the fourth hole group 946 may be between about 35% and about 65% of the radius of the mask 900. Angular extent of the holes of the fourth hole group 946 may be about 15° with respect to a radius of curvature located about r=2" or about 23% of the radius of the mask 900.

A fifth hole group 948 of the mask 900 has 2 rings of elongated holes at about r=2.6" and about r=2.0", or about 23% and 30% of the radius of the mask 900, respectively, each ring having 12 holes. Radial extent of the fifth hole group 948 may be between about 20% and about 32% of the radius of the mask 900. Angular extent of the holes of the fifth hole group 948 may be about 30° with respect to a radius of curvature located about r=0.9" or about 10% of the radius of the mask 900.

Disclosed embodiments of the present invention provide a pattern of features for an electrostatic chuck assembly for reduced particle generation and reduced wear of substrates and chucking devices.

Figure 10:
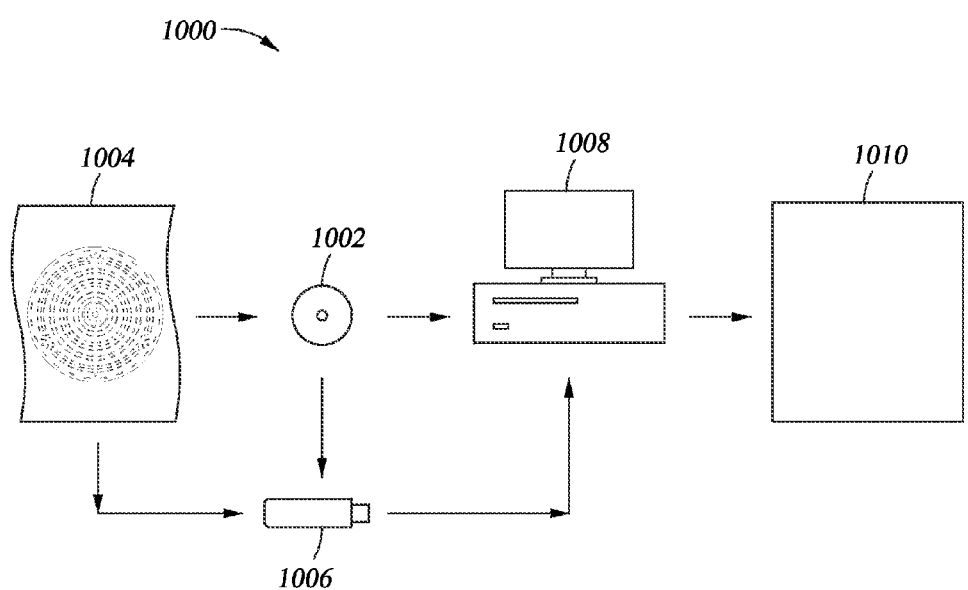
FIG. 10 is a schematic representation of a data system 1000 according to one embodiment.

In one embodiment, an electrostatic chuck assembly as described herein, a mask for making a coating for an electrostatic chuck assembly as described herein, or a coating for an electrostatic chuck assembly as described herein may be represented in a data structure readable by a computer rendering device or a computer display device. FIG. 10 is a schematic representation of a data system 1000 with a computer-readable medium 1002 according to one embodiment. The computer-readable medium 1002 may contain a data structure 1004 that represents the mask, the electrostatic chuck assembly, and/or the coating. The data structure 1004 may be a computer file, and may contain information about the structures, materials, textures, physical properties, design or other characteristics of one or more articles. The data structure 1004 may also contain instructions, such as design information and/or code, for example computer executable code or device control code, that engages selected functionality of a computer rendering device or a computer display device. The data structure 1004 may be stored on a physical storage medium 1006, such as a magnetic memory, floppy disk, or any convenient physical storage medium. The physical storage medium 1006 may be readable by the data system 1000 to render the article represented by the data structure 1004 on a computer screen 1008 or a physical rendering device 1010, which may be an additive manufacturing device, such as a 3D printer.

Figure 11:
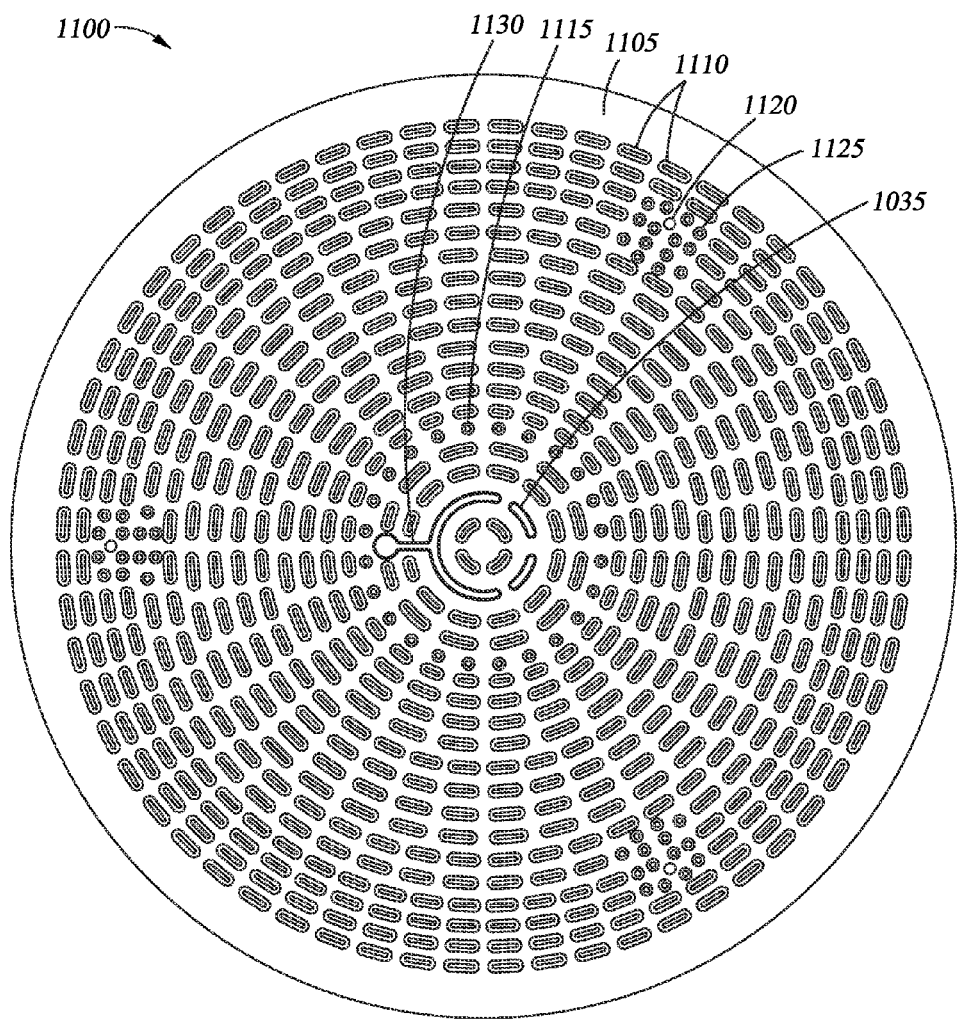
FIG. 11 illustrates a bottom view of a mask for producing an electrostatic chuck surface with an arrangement of pads, according to another embodiment.

FIG. 11 illustrates a bottom view of a mask 1100 for producing an electrostatic chuck surface with an arrangement of pads, according to another embodiment. The mask 1100 has a mask surface 1105 and a plurality of openings typically corresponding to a desired pattern of features on the chuck surface, such as elongated openings 1110, rounded openings 1115, lift pin hole openings 1120, rounded openings 1125, and center tap openings 1130 and 1135. Mask 1100 may have a uniform thickness; alternate embodiments may provide a varying mask thickness. As described above with respect to FIGS. 5-7, the openings may have a non-uniform profile through the mask (for example, openings may be tapered or may have sections with differing profiles). The openings may be straight or curved, and may be arranged to provide a desired distribution and orientation of features on the chuck surface. For example, openings such as elongated openings 1110 may be arranged to form concentric circles about a center of the mask surface 1105, which correspondingly may produce features such as bumps, mesas, or pads arranged in concentric circles about a center of an electrostatic chuck surface.

Figure 12:
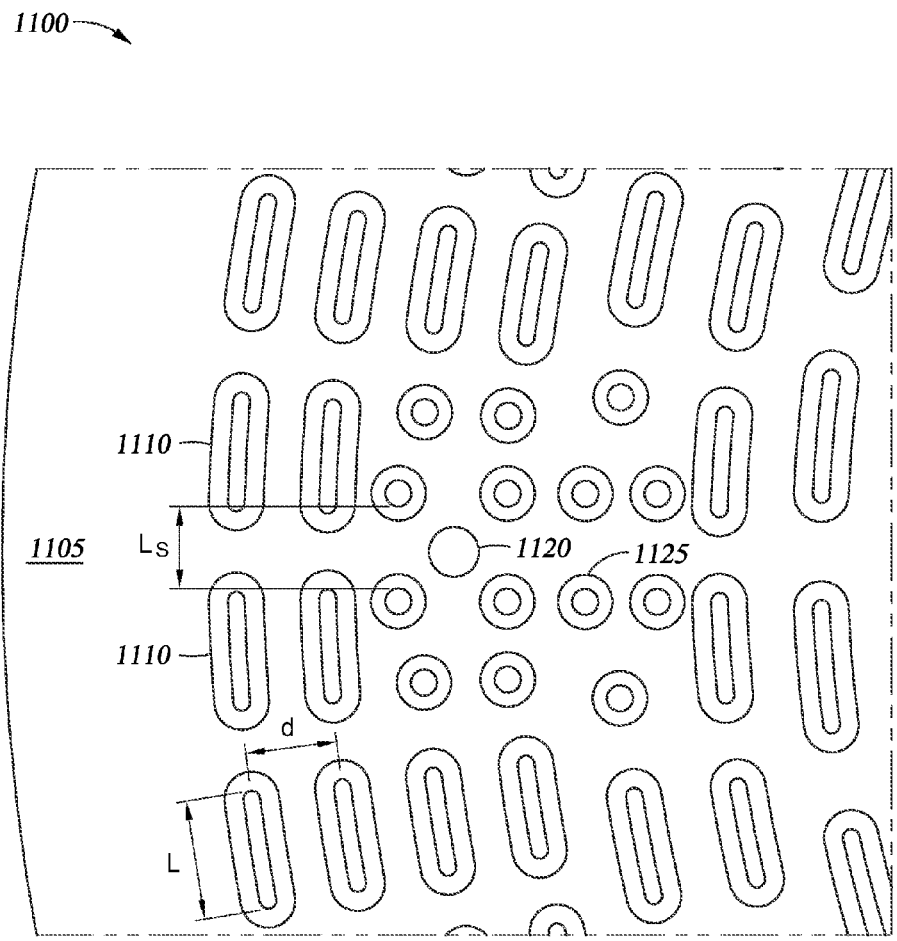
FIG. 12 illustrates a magnified bottom view of a portion of the mask of FIG. 11.

FIG. 12 illustrates a magnified bottom view of the mask 1100. The mask surface 1105 and openings, such as elongated openings 1110, lift pin hole openings 1120, and rounded openings 1125, are visible in FIG. 12. Distances between openings may be preferentially selected to provide features having a desired chucking force and/or heat transfer, for example. In one embodiment, openings such as elongated openings 1110 may be arranged in concentric circles, and may have a lateral distance between adjacent circles (d) of about 0.1 inches to about 0.5 inches. In one embodiment, a length of elongated openings 1110 (l) may also fall within a range of about 0.1 inches to about 0.5 inches. In one embodiment, a length between adjacent elongated openings 1110 within the same concentric circle ($l_s$) may also fall within a range of about 0.1 inches to about 0.5 inches.

Figure 13:
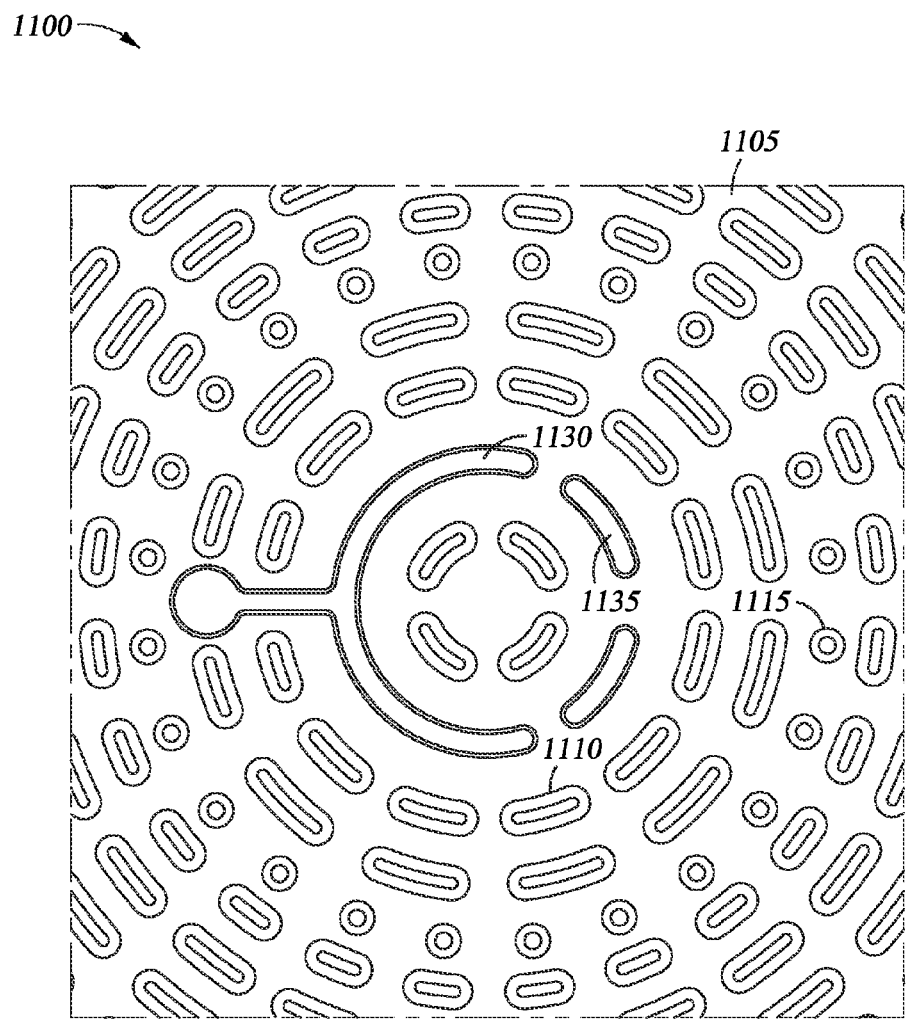
FIG. 13 illustrates a magnified bottom view of a different portion of the mask of FIG. 11.

FIG. 13 illustrates a magnified bottom view of the mask 1100. The mask surface 1105, elongated openings 1110, rounded openings 1115, and center tap openings 1130 and 1135 are visible in FIG. 13.

Figure 14:
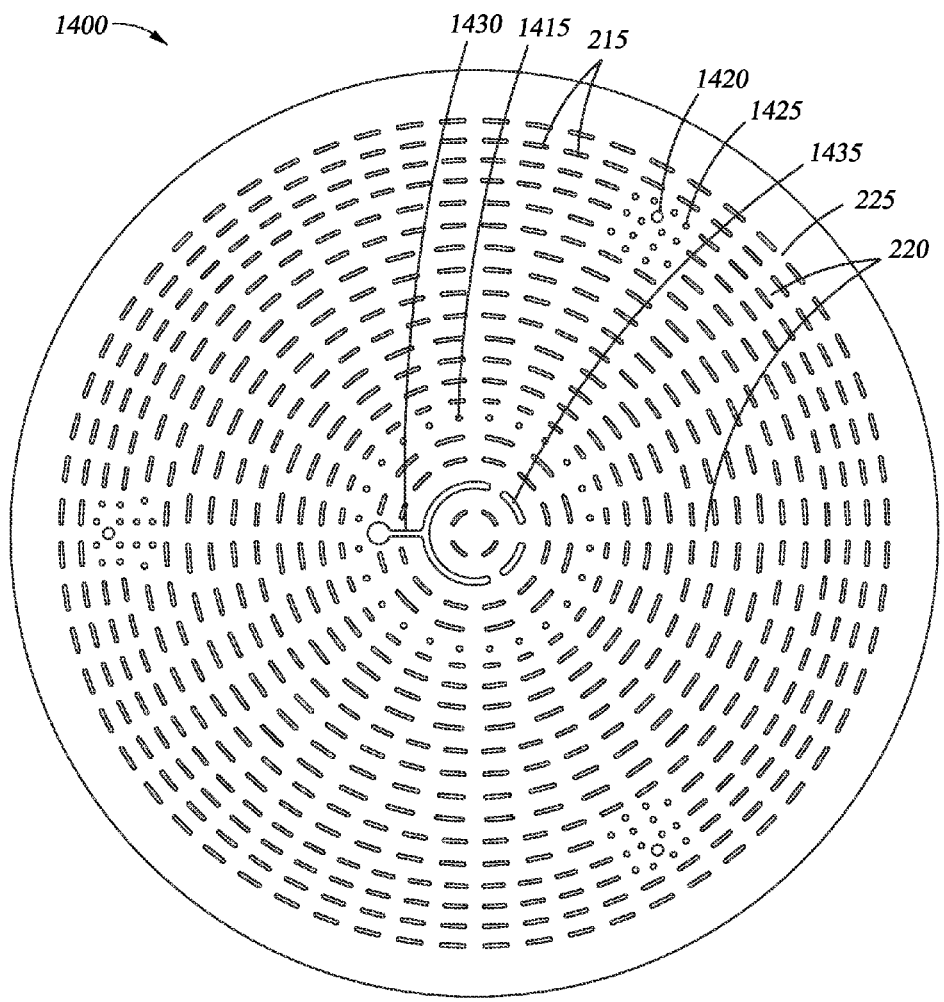
FIG. 14 illustrates a top view of an electrostatic chuck surface with an arrangement of minimum contact area features, according to one embodiment.

FIG. 14 illustrates a top view of an electrostatic chuck surface 1400 with an arrangement of minimum contact area features, according to one embodiment. The electrostatic chuck surface 1400 may be applied to the electrostatic chuck assembly 120 of FIG. 1. The electrostatic chuck surface 1400 has a plurality of features of deposited material that correspond to the mask openings previously described with respect to FIGS. 11-13. The electrostatic chuck surface 1400 may include a layer of the same materials deposited to form the features; alternately, surface 905 may not include any of the deposited materials. Features may include elongated features such as mesas 215, rounded features 1415 and 1425, and center tap features 1430 and 1435. The surface 1400 may also have lift pin hole openings 1420. The features may generally be arranged in concentric circles, and an outermost circle of features may comprise an outer peripheral ring such as the outer peripheral ring 225 of FIG. 2A or 2B. The gas grooves 220 may be implemented along the electrostatic chuck surface 1400 between the mesas 215; the gas grooves 220 may also have concentric shapes, or may also extend in different directions, such as radially from a center of the surface 1400.

The dimensions and arrangement of features on the surface 1400 may directly correspond to the openings in the mask 1100. Therefore, in one embodiment, features may be arranged in concentric circles, and may have a lateral distance between adjacent circles of about 0.1 inches to about 0.5 inches. The length of elongated features, such as mesas 215, may also fall within a range of about 0.1 inches to about 0.5 inches. The length between adjacent elongated features, such as mesas 215, within the same concentric circle may also fall within a range of about 0.1 inches to about 0.5 inches. As described above, mesa height $h_M$ may be about 1 micron to about 100 microns, or more preferably between about 1 micron and 30 microns, for example, about 10 microns.

Figure 15:
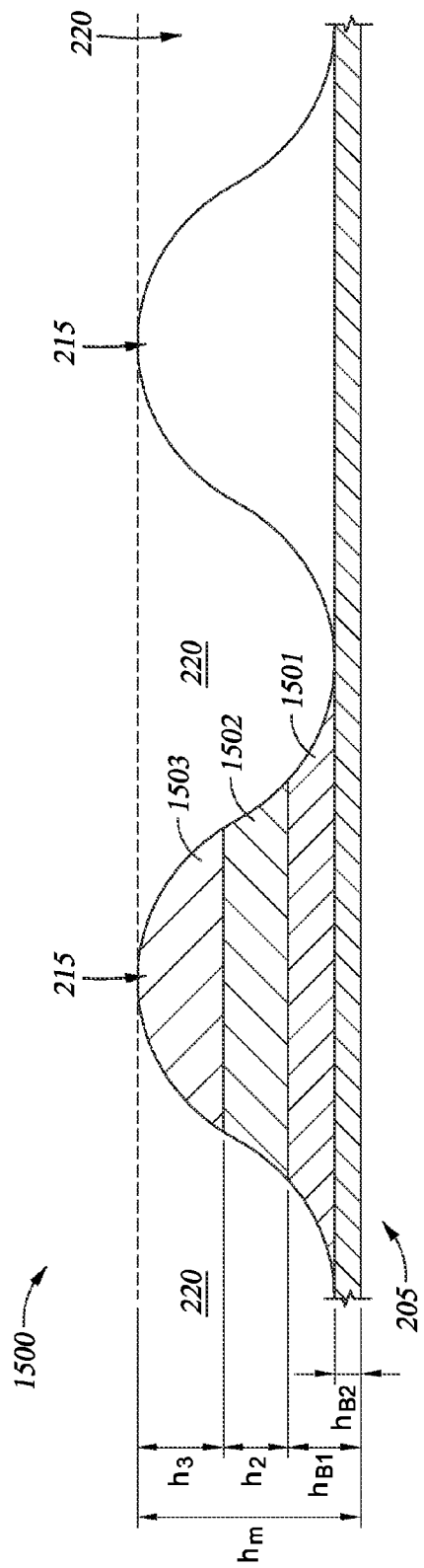
FIG. 15 illustrates a cross-sectional detail view of adjacent features on an electrostatic chuck surface, according to one embodiment.

FIG. 15 illustrates a cross-sectional detail view of adjacent features on an electrostatic chuck surface, according to one embodiment. The features described in FIG. 15 may be implemented on any of the electrostatic chuck surfaces described herein, for example any electrostatic chuck surface made according to methods described herein, using materials described herein, and using patterns and masks described herein. To provide further wear reduction and particle generation reduction for an electrostatic chuck surface, a material composition to be deposited onto the surface as the material layer may be preferentially selected based on several properties. For example, an improved surface may exhibit one or more of a greater hardness, a greater modulus of elasticity, reduced coefficient of friction, and/or a reduced wear factor. In one embodiment, the material layer may include titanium nitride. In another embodiment, the material layer may include known diamond-like carbon (DLC) compositions, which may include commercially available products such as DYLYN™ (a trademark of Sulzer Ltd.).

An alternative material composition for wear reduction and particle generation reduction will now be described. As shown, a feature 1500, which may be a minimum contact area feature as described herein, may have a base layer 1501 of a target material having a first thickness $h_{B1}$. The target material may be introduced through the mask openings onto the frontside surface of the electrostatic chuck, such as surface 1400 or electrostatic chuck surface 800, and may be more evenly distributed across the surface (for example, by heating occurring within the chamber 100). This base layer 1501 of a target material may extend between adjacent features (i.e., adjacent mesas 215) and may define the lower bound for a measurement of mesa height $h_M$. In an alternate embodiment, the target material extending between adjacent features may have a lesser thickness ($h_{B2}$) than that of the base layer ($h_{B1}$). In one embodiment, a feature has a base layer of titanium.

Above the base layer 1501, one or more additional layers may be deposited through the mask onto the feature. The additional layers may be deposited discretely (i.e., as distinct layers, each having uniform properties throughout the layer), or may have gradation (i.e., a gradual change in properties) across one or more layers.

A second layer 1502 having height $h_2$ may be deposited onto the base layer of the feature by introducing one or more precursor gases into the PVD chamber. Generally, the concentration of each element deposited into the layer is proportional to, and thus may be controlled by adjusting, the feed rate of the precursor gas(es) into the chamber.

For example, second layer 1502 may be deposited onto the feature that includes a combination of titanium, carbon, silicon, and hydrogen atoms in desired proportions or within desired ranges. Example precursor gases used to produce this layer may include silane (having silicon and hydrogen atoms), and methane, ethane, and propane (each having carbon and hydrogen atoms), or any other suitable hydrocarbon. In one embodiment, the second layer may include an atomic concentration of between about 5% and about 50% silicon atoms, such as between about 15% and about 30% silicon atoms.

Continuing the example, a third layer 1503 may next be deposited onto the second layer 1502 of the feature 1500, having a reduced proportion of silicon and titanium atoms as compared to the second layer 1502. The proportion of silicon may be reduced by reducing the feed of the corresponding precursor gas silane) to the chamber, while the proportion of titanium may be reduced by slowing the PVD process, for example, by reducing the power delivered by the target power source (or the power to the magnetron) to reduce the respective fields that sustain the plasma within the chamber. The upper portions of the feature thus contain an increasing proportion of carbon atoms.

In one embodiment, the feature 1500 has a base that is near 100% titanium, with atomic concentration of titanium reducing smoothly to near zero at mid-height of the feature 1500. Silicon and carbon atomic concentration may increase smoothly from near zero at the base of the feature 1500 to between about 30% and about 80% carbon and to between about 5% and about 50% silicon at the apex of the feature 1500, with the balance being hydrogen.

The disclosed material composition is particularly beneficial as providing increased modulus, hardness, and operation life, and decreased wear factor compared to DYLYN™ or titanium nitride.

While the above example was described as the deposition of discrete layers, note that producing the feature may alternately occur as one continuous deposition process, in which changes to the concentrations of elements in the layers may be gradual and not sharply defined.

Figure 16:
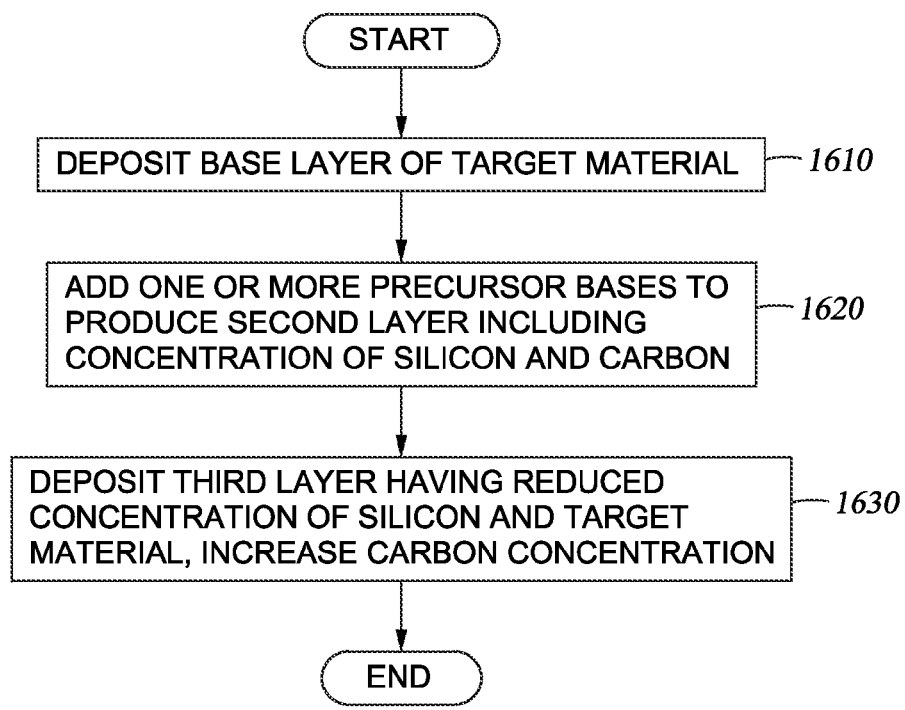
FIG. 16 illustrates a method for producing a feature on the surface of an electrostatic chuck, according to one embodiment.

FIG. 16 illustrates a method for producing a feature on the surface of an electrostatic chuck, such as the electrostatic chuck surface 1400 or the electrostatic chuck surface 800, having the material composition described above with respect to FIG. 15, according to one embodiment. The method of FIG. 16 may be used with the chamber of FIG. 1 and the masks of FIG. 3-8 or 11-13 to produce the electrostatic chuck surface 1400 of FIG. 14 or the electrostatic chuck surface 800 of FIG. 8.

The method begins at block 1610, where a base layer of the target material is deposited on the surface of the electrostatic chuck surface. For example, the target power source may create and sustain a plasma in the chamber using an inert gas (such as argon), causing sputter emission of the target material onto the chuck surface. The sputtering of the target material may continue over a predefined period of time. In one embodiment, the target power source may deliver about 5-10 kW of RF power into the chamber within an approximate frequency range of 1-13.56 MHz, the target material may be titanium, and the predefined period of time may be about 10 seconds. Alternate embodiments may vary any of the amplitude or frequency of power (or provide DC power), the target material, and the amount of time.

At block 1620, and upon the end of the predefined period, one or more precursor gases may be introduced into the chamber to deposit a second layer on the chuck surface that includes concentrations of silicon and carbon. Any suitable precursor gases may be introduced to produce this layer; this may include silane (having silicon and hydrogen atoms), and at least one of methane, ethane, and propane (each having carbon and hydrogen atoms), or any other suitable hydrocarbon. For example, silane may be introduced into the chamber at a rate of 200 standard cubic centimeters per minute (SCCM) for a period of 10 seconds, after which, propane may be introduced into the chamber at 200 SCCM for a period of 10 seconds. Alternate embodiments may provide any of different gases, different flow rates, different amounts of time, and different orders of introduction of the gases (or possibly simultaneous introduction of the gases).

At block 1630, a third layer may be deposited onto the chuck surface by decreasing the concentration of the target material being deposited. Substantially concurrently, the concentration of silicon being deposited may also be reduced, and the concentration of carbon being deposited may be increased. The concentration of the target material may be reduced by reducing the power delivered by the target power source, and the concentrations of silicon and carbon may be adjusted by changing the feed rate of the respective precursor gas into the chamber. For example, the target power source may have its output ramped down from 10 kW to zero over a period of 20 seconds, and the influx of propane precursor gas may be ramped up to 200 SCCM over 40 seconds while the influx of silane may be gradually reduced to zero during the same 40 second period. These adjustments will generally cause the concentrations of the target material and silicon to gradually decrease in the upper portions of the feature, while the proportion of carbon atoms in the same portions will increase. The uppermost portions of the feature may entirely lack target material and silicon, and be comprised of carbon and/or hydrogen atoms.

Other silicon precursors that may be used include higher silanes, such as disilane and trisilane, organosilanes such as alkyl silanes, for example methyl silane, dimethyl silane, trimethyl silane, and tetramethyl silane. Organo di- and tri-silanes may also be used.

Disclosed embodiments of the present invention provide a pattern of features for an electrostatic chuck assembly, a material composition, and a method of creating the material composition that are directed toward providing reduced particle generation and reduced wear of substrates and chucking devices.

While the foregoing is directed to embodiments of the invention, other and further embodiments of the invention may be devised without departing from the basic scope thereof.

The invention claimed is:

1. An electrostatic chuck, comprising:
a chuck surface; and
a pattern of bumps on the chuck surface, the pattern comprising:
a serpentine bump at a central region of the chuck surface; and
a first group of bumps with three sub-groups spaced at equal angular distance around a periphery of the chuck.

2. The electrostatic chuck of claim 1, wherein the pattern of bumps further comprises a second group of bumps with three sub-groups, each sub-group of the second group of bumps disposed between two sub-groups of the first group of bumps.

3. The electrostatic chuck of claim 2, wherein the pattern of bumps further comprises a plurality of elongated bumps arranged in concentric rings.

4. The electrostatic chuck of claim 3, wherein the serpentine bump has a central straight portion and two outer curved portions, and the pattern of bumps further comprises a group of round bumps in two sub-groups, one sub-group on either side of the central straight portion of the serpentine bump.

5. The electrostatic chuck of claim 4, further comprising a plurality of elongated bumps between the second group of bumps and the serpentine bump.

6. The electrostatic chuck of claim 5, wherein the bumps of the plurality of bumps between the second group of bumps and the serpentine bump are curved, radially aligned, and arranged in concentric rings.

7. The electrostatic chuck of claim 4, wherein the plurality of bumps between the second group of bumps and the serpentine bump has a radial extent between about 22% and about 70% of a radius of the electrostatic chuck.

8. The electrostatic chuck of claim 4, wherein the round bumps are between the central straight portion of the serpentine bump and the outer curved portions of the serpentine bump.

9. The electrostatic chuck of claim 1, wherein the serpentine bump has a central straight portion and two outer curved portions.

* * * * *